(12) United States Patent
Dey

(10) Patent No.: US 10,785,874 B2
(45) Date of Patent: Sep. 22, 2020

(54) DETECTING CARD EDGE CONNECTOR CONFIGURATION STATES

(71) Applicant: HEWLETT PACKARD ENTERPRISE DEVELOPMENT LP, Houston, TX (US)

(72) Inventor: Nilashis Dey, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/245,457

(22) Filed: Jan. 11, 2019

(65) Prior Publication Data

US 2020/0229306 A1 Jul. 16, 2020

(51) Int. Cl.
H05K 7/00 (2006.01)
H05K 1/16 (2006.01)
H05K 7/14 (2006.01)
H01R 12/72 (2011.01)

(52) U.S. Cl.
CPC .......... *H05K 1/167* (2013.01); *H01R 12/721* (2013.01); *H05K 7/1487* (2013.01); *H05K 7/1489* (2013.01)

(58) Field of Classification Search
CPC .... H05K 1/167; H05K 7/1489; H05K 7/1487; H01R 12/721
See application file for complete search history.

(56) References Cited

U.S. PATENT DOCUMENTS

| | | | | |
|---|---|---|---|---|
| 6,496,380 B1* | 12/2002 | Li | ............................ | G11C 5/04 361/760 |
| 6,771,515 B2* | 8/2004 | McCall | .................. | G11C 5/063 257/723 |
| 6,785,142 B1 | 8/2004 | Regimbal et al. | | |
| 7,019,983 B2* | 3/2006 | Record | .................... | G06F 1/189 361/760 |
| 7,562,271 B2* | 7/2009 | Shaeffer | ............... | G11C 7/1006 714/724 |
| 8,843,604 B2 | 9/2014 | Chu et al. | | |
| 8,990,465 B2 | 3/2015 | DeCesaris et al. | | |
| 2004/0143773 A1* | 7/2004 | Chen | ................... | G06F 13/1689 713/400 |
| 2007/0070669 A1* | 3/2007 | Tsern | ..................... | G11C 5/063 365/51 |
| 2013/0155601 A1* | 6/2013 | Tian | .................... | G06F 11/3051 361/679.31 |

OTHER PUBLICATIONS

Maxim; "Server Monitoring and Security"; downloaded on Sep. 26, 2018 from webpage: https://www.maximintegrated.com/en/products/digital/one-wire/rack-card-calibration-and-control.html; 3 pages.
Watts, D.; "BladeCenter S Product Guide (withdrawn product)"; Lenovo Press; https://lenovopress.com/tips0977-bladecenter-s; updated Jun. 25, 2014; 11 pages.

* cited by examiner

*Primary Examiner* — Yuriy Semenenko
(74) *Attorney, Agent, or Firm* — Trop, Pruner & Hu, P.C.

(57) ABSTRACT

A technique includes coupling a resistor network to a plurality of card edge connectors. The resistor network has a resistance, and each card edge connector includes electrical contacts to couple a resistor of a circuit card assembly, when inserted into the card edge connector, to the resistor network to alter the resistance of the resistor network. The technique includes determining a state of the plurality of card edge connectors based on a signal that is provided by the resistor network.

12 Claims, 7 Drawing Sheets

| CARD EDGE CONNECTOR CONFIGURATION STATE | EC1 | EC2 | EC3 | R_PULLUP | V_SENSE |
|---|---|---|---|---|---|
| ALL PRESENT | CA1 | CA2 | CA3 | 4.84 Ω | 2.48V |
| CA1 MISSING | EMPTY | CA2 | CA3 | 4.94 Ω | 2.43V |
| CA2 MISSING | CA1 | EMPTY | CA3 | 6.13 Ω | 1.96V |
| CA3 MISSING | CA1 | CA2 | EMPTY | 7.11 Ω | 1.69V |
| CA1 AND CA2 SWAPPED | CA2 | CA1 | CA3 | 4.37 Ω | 2.74V |
| CA2 AND CA3 SWAPPED | CA1 | CA3 | CA2 | 4.62 Ω | 2.60V |
| CA1 AND CA3 SWAPPED | CA3 | CA2 | CA1 | 3.60 Ω | 3.33V |
| CA1 MISSING, AND CA2 AND CA3 SWAPPED | EMPTY | CA3 | CA2 | 4.72 Ω | 2.54V |
| CA2 MISSING, AND CA1 AND CA3 SWAPPED | CA3 | EMPTY | CA1 | 4.89 Ω | 2.45V |

FIG. 3

DETECTING CARD EDGE CONNECTOR CONFIGURATION STATES

BACKGROUND

A computer system may contain one or multiple card edge connectors, which allow removable, modular circuit card assemblies, such as storage cards, blade servers, expansion bus cards, and so forth, to be installed in and removed from the computer system. The card edge connector may have a slot in which spring-like electrical contacts are disposed. The card edge connector is constructed to receive an edge of a circuit card assembly in the slot; secure the circuit card assembly by virtue of contact between the spring electrical contacts of the connector and the edge of the circuit card assembly; and form electrical connections between the electrical contacts of the connector and corresponding electrical traces that are disposed on the edge of the circuit card assembly. As a more specific example, a computer system may include a blade chassis subsystem, which has bays with card edge connectors so that a blade module, such as a server, storage or switch module, may be inserted into a bay and be connected to a corresponding card edge connector. As another example, a computer system may have a motherboard that contains card edge connectors in which expansion bus circuit card assemblies may be installed.

BRIEF DESCRIPTION OF THE DRAWINGS

FIG. 3 is an illustration of example card edge connector configuration states and corresponding voltages sensed by a management controller according to an example implementation.

DETAILED DESCRIPTION

Figure 1:
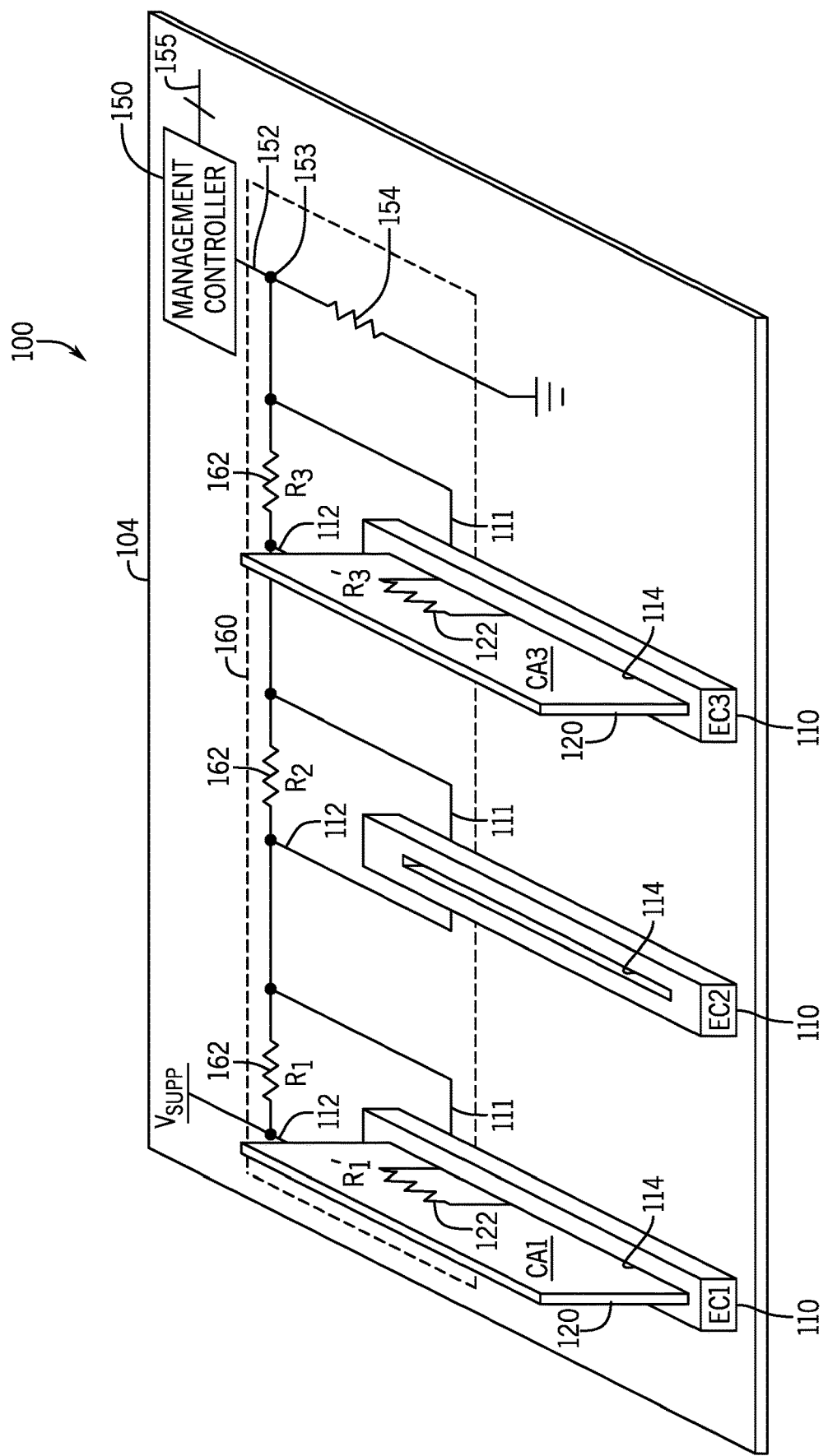
FIG. 1 is a schematic diagram of a computer subsystem containing card edge connectors and circuit card assemblies according to an example implementation.

A given computer system (a blade chassis computer system, a rack-mounted computer system, and so forth) may contain card edge connectors (or "slot connectors") for purposes of allowing removable, modular circuit card assemblies to be installed in and removed from the computer system. The population of such circuit card assemblies in the computer system may change over time. Some card edge connectors may, at a given time, be empty, whereas circuit card assemblies may be installed in other card edge connectors of the computer system. Moreover, the computer system may be rather flexible regarding the selection of circuit card assemblies and slot assignments for the circuit card assemblies, so that a variety of different system configuration choices are available.

For such purposes as determining which circuit card assemblies are installed, determining the specific slot numbers in which circuit card assemblies are installed, determining which card edge connectors are empty, and detecting the insertion of an unrecognized circuit assembly, the computer system may have a management controller that is constructed to communicate with installed circuit card assemblies using dedicated edge connector contacts.

For example, a management controller may be connected to a given card edge connector through a pair of Inter-Integrated Circuit ($I^2C$) bus communication lines. The management controller may attempt to communicate with a memory (an EEPROM, for example) of a circuit card assembly that is installed in the connector over the $I^2C$ bus communication lines; and if successful, the management controller learns the identity of the installed circuit card assembly. If unsuccessful, then a circuit card assembly may not be installed, an incompatible circuit card assembly may be installed, or a malfunctioning circuit card assembly may be installed.

In view of the ever-increasing density of removable circuit card assemblies in computer systems, the above-described approach may become increasingly more expensive and may incur an ever-increasing amount of circuit board space. In this manner, with this approach, $I^2C$ bus communication lines are routed between each card edge connector and the management controller, and as such, a pair of $I^2C$ bus communication traces are added for each card edge connector and consume a corresponding pair of pins on the management controller. Moreover, this approach may relatively unreliable due to the $I^2C$ bus "hanging" when attempting to read the circuit card assembly memories, and/or due to the circuit card assembly stalling when booting up after being installed.

In accordance with example implementations that are described herein, a computer system includes a resistor network that, regardless of the number of card edge connectors of the system, provides a signal to a single input of a management controller, which the controller may use to identify a card edge connector configuration state for the computer system. In the context of this application, a "card edge connector configuration state refers to a particular state that is associated with the card edge connectors of the computer system. The card edge connector state may identify, or indicate, one or multiple of the following: the presence/absence of circuit card assemblies in corresponding card edge connectors; the identities, or types, of the circuit card assemblies that are installed in the card edge connectors; and/or the particular sequence, or order, in which the circuit card assemblies are inserted in the card edge connectors.

Here, the "presence" associated with a particular card edge connector refers to whether a circuit card assembly is inserted, or installed, in the card edge connector; and the "type" associated with a given card edge connector refers to the particular category of circuit card assembly that is installed in the card edge connector, such as a server card assembly, a storage card assembly, a particular type of server card assembly, an unrecognized circuit card assembly, and so forth. In accordance with some implementations, the "type" may be associated with a particular category of circuit card assembly, as well as possibly other features of the assembly, such as a manufacturer and model of the assembly.

The "sequence" associated with the card edge connectors refers to the particular order in which the circuit card assemblies are installed in the card edge connectors. For example, two example circuit card assemblies CA1 and CA3 may be installed in one of the following four example distinct sequences: circuit card assemblies CA1 and CA3 may be installed in card edge connectors EC1 and EC5, respectively; circuit card assemblies CA1 and CA3 may be installed in card edge connectors EC5 and EC1, respectively; circuit card assemblies CA1 and CA3 may be installed in card edge connectors EC2 and EC5; and circuit card assemblies CA1 and CA3 may be installed in card edge connectors SC1 and SC4, respectively.

In accordance with example implementations, the resistor network that provides the signal to the input of the management controller may be disposed on a printed circuit board assembly (a motherboard or a backplane, as examples) on which the card edge connectors are mounted. In this manner, the card edge connectors may be mounted to the printed circuit board assembly; electrical traces of the printed circuit board assembly may be electrically connected to electrical contacts of the card edge connectors; resistors of the resistor network may be mounted to the printed circuit board assembly; and electrical traces of the printed circuit board assembly may be electrically connected to the resistors of the resistor network and to the card edge connectors, as further described herein. Moreover, the management controller may be mounted to the printed circuit board assembly, and electrical traces of the printed circuit board assembly may be electrically connected to the management controller.

In accordance with example implementations, the resistor network effectively serves as a pullup resistor between the input of the management controller and a supply voltage, and the overall, or composite, resistance of this pullup resistor is a function of the card edge connector state of the computer system.

More specifically, in accordance with example implementations, the circuit card assembly has an associated resistor whose terminals are connected to a pair of electrical card connector contacts of the assembly. The card edge connector has a pair of electrical contacts that correspond to these electrical card connector contacts and are connector to the resistor network. Therefore, when the circuit card assembly is inserted into a card edge connector, the on-card resistor of the assembly is electrically coupled to the resistor network, and the coupling of the on-card resistor of the circuit card assembly to the resistor network, in turn, alters, or modifies, the overall resistance of the resistor network. In other words, the coupling of the on-card resistor of the circuit card assembly to the resistor network changes the pullup resistance seen at the input of the management controller to correspondingly change the signal that is provided by the resistor network to the management controller.

In accordance with example implementations, the pullup resistor is formed from a chain of serially coupled resistors, where the terminals of each resistor of the chain is coupled to a pair of electrical contacts of a different card edge connector. Moreover, in accordance with example implementations, the circuit card assemblies have different associated on-card resistances, and each resistor of the chain of serially coupled resistors of the resistor network have different resistances. In accordance with example implementations, a specific card edge connector configuration state, such as a state associated with the presence of circuit card assemblies in the card edge connectors, the identities of the circuit card assemblies and their associated sequence establish a specific card edge connector configuration state and correspondingly establish a corresponding pullup resistance. Moreover, a voltage that is present on the sensing line (monitored by the management controller) is a function of this pullup resistance and, in accordance with example implementations, identifies a specific card edge connector configuration state. In other words, in accordance with example implementations, there may be a set of possible card edge connector configuration states, and each of these states, in turn, produces a different corresponding voltage on the input to the management controller. Therefore, by reading, or measuring, the voltage of its input, he management controller may determine, or identify, a particular card edge connector configuration state for the computer system.

As a more specific example, FIG. 1 depicts a subassembly 100 of a computer system, in accordance with example implementations. The subassembly 100 may take on numerous forms, such as a backplane, a motherboard, and so forth. For the specific example of FIG. 1, the subassembly 100 includes a printed circuit board (PCB) substrate 104, and a management controller 150, a resistor network 160 and three card edge connectors 110 are mounted to the PCB substrate 104. It is noted that three card edge connectors 110 are illustrated in FIG. 1 merely for purposes of an example, as the subassembly 100 may contain fewer than three card edge connectors 110 or more than three card edge connectors 110, in accordance with further example implementations.

In the following discussion, specific card edge connectors 110 are referred to using the following identifiers: "EC1" (the left most card edge connector 110), "EC2" (the middle card edge connector 110), and "EC3" (the right most card edge connector 110).

There may be a number of different circuit card assemblies 120 that may be inserted into the card edge connectors 110 in different orders; not all of the card edge connectors 110 may be occupied; and moreover, there may be many more types of circuit card assemblies 120 than card edge connectors 110. For the specific example of FIG. 1, circuit card assemblies 120 are inserted into card edge connectors EC1 and EC3, with card edge connector EC2 being empty, or unoccupied. The particular circuit card assemblies 120 that are inserted into the card edge connectors 110, as well as the specific order, or sequence, of the installed circuit card assemblies 120 form a particular card edge connector configuration state for the computer system.

In the following discussion, the identifier "CA1" is used to refer to the left circuit card assembly 120, which is depicted in FIG. 1 as being installed in the card edge connector EC1; and the identifier "CA3" refers to the right circuit card assembly 120 that is depicted in FIG. 1 as being installed in the card edge connector EC3. Moreover, it is noted that the following examples illustrate different card edge connector configuration states: the circuit card assembly CA1 and CA3 being inserted into respective card edge connectors EC1 and EC3, as illustrated in FIG. 1; the circuit card assemblies CA1 and CA3 being swapped from the depicted illustration in FIG. 1 and thereby being installed in card edge connectors EC3 and EC1, respectively; only one of the circuit card assemblies CA1 and CA3 being installed in the card edge connectors EC1, EC2 and EC3; the circuit card assembly CA3 being installed in the card edge connector EC2, instead of in the card edge connector EC3; another circuit card assembly being installed in the card edge connector EC2; and so forth.

For purposes of detecting the card edge connector configuration state, the management controller 150 reads, or measures, a signal that is provided by the resistor network 160 to an input 152 of the management controller 150. In accordance with example implementations, the management controller 150 may be a microcontroller that has an analog-to-digital converter (ADC) that converts a voltage on the input 152 to a corresponding digital value, and this voltage (digital value) identifies the card edge connector configuration state. Therefore, by reading the voltage on the input 52, the management controller 150 may take appropriate action, such as generating one or multiple signals (on one or multiple signal lines 155, for example) which notify other components of the computer system as to the card edge connector configuration state.

In accordance with example implementations, the input 152 to the management controller 150 is coupled to a node 153 of the resistor network 160. The resistor network 160 has electrical connections with the card edge connectors 110 such that a resistance of the resistor network 160 is changed, or altered by, the particular card edge connector configuration state.

More specifically, in accordance with example implementations, the resistor network 160 effectively forms a pullup resistor between the node 153 and a supply voltage (called "$V_{SUPP}$" herein), and the node 153 may be coupled to ground through a corresponding resistor 154 of the resistor network 160, as depicted in FIG. 1. The pullup resistance (i.e., the resistance between the node 153 and the $V_{SUPP}$ supply voltage) is a function of the card edge connector configuration state.

In accordance with further example implementations, the resistor network 160 may be coupled between positive and negative supply voltage rails or coupled between a negative supply voltage and ground. Moreover, in accordance with example implementations, the resistor network 160 may form a pulldown resistor between an input of a management controller and ground. Regardless of its particular form, the resistor network 160 provides a signal that is a function of a card edge connector state of a computer.

For the example implementation that is depicted in FIG. 1, the pullup resistor is formed from a chain of serially coupled resistors 162, which is coupled between the $V_{SUPP}$ supply voltage and the node 153. Each resistor 162, in turn, is associated with a particular card edge connector 110, and the terminals of the resistor 162 is coupled via corresponding electrical traces 111 and 112 to corresponding electrical contacts of the associated card edge connector 110.

Moreover, in accordance with example implementations, the resistors 162 have different corresponding resistances. In this manner, the resistor 162 that corresponds to the card edge connector EC3 has a resistance R3, and the terminals of the resistor 162 are coupled by traces 111 and 112 to electrical contacts of the card edge connector EC3. The resistor 162 that corresponds to the card edge connector EC2 has a resistance R2, and the terminals of the resistor 162 are coupled by traces 111 and 112 to a pair of electrical contacts of the card edge connector EC2. The resistor 162 that corresponds to the card edge connector EC1 has a resistance R1, and the terminals of the resistor 162 are coupled by traces 111 and 112 to a pair of electrical contacts of the card edge connector EC1.

The circuit card assembly 120 has a resistor 122 that is coupled to the resistor network 160 when the circuit card assembly 120 is installed in the card edge connector 110. For the example implementation that is depicted in FIG. 1, the circuit card assembly CA3 has an on-card resistor 122 that has a corresponding resistance called "R3'," and the circuit card assembly CA1 has an on-card resistor 122 that has a corresponding resistance called "R1'." Therefore, for the particular card edge connector configuration state that is depicted in FIG. 1, the resistor 122 on the circuit card assembly CA3 couples in parallel with the resistor 162 that is associated with the card edge connector EC3; and the resistor 122 on the circuit card assembly CA1 couples in parallel with the resistor 162 that is associated with the card edge connector EC1. As no circuit card assembly 120 is inserted into the card edge connector SC2 for the example of FIG. 1, the corresponding resistor 162 (having a resistance R2) is not coupled to a circuit card assembly-disposed resistor.

The advantages of the systems and techniques that are described herein for detecting card edge connector configuration states may include one or more of the following. Tens of circuit traces may be reduced to a single trace. Types of circuit card assemblies may be detected in addition to detecting the specific connector locations (i.e., detecting the sequence) in which the assemblies are installed. The pin count on the management controller may be reduced, as multiple signals may be reduced to a single presence signal that is provided to the management controller. Detecting the card edge connector configuration state may not depend on bus communications and as such, may avoid failures due to bus hang-ups. Detecting the card edge connector configuration state may be passive in nature and as such, may avoid failures due to boot-up problems or delays with circuit card assemblies.

More specifically, the following features that are described herein have the benefits (both individually and in combination) of circuit trace reduction, management controller pin count reduction and more robust detection that is independent of bus communication and card boot-ups: detecting the presence of a circuit card assembly inserted in a given card edge connector, identifying a circuit card assembly inserted in a given card edge connector, determining a mapping of multiple circuit card assemblies to multiple card edge connectors, determining a card edge connector stage based on a voltage provided by a resistor network, using the resistor network as a pullup resistor between a sensing terminal of a controller and a supply voltage, a resistor network including a plurality of serially coupled resistors that have different resistances, and coupling a resistor of the resistor network in parallel with a resistor of a circuit card assembly. Moreover, the circuit card assemblies may be a wide variety of different categories, or types, of assemblies, such as server cards, storage cards or expansion cards, which allows the techniques and systems that are described herein to be independent of the type of card that is installed in the computer. Additionally, the techniques and systems that are described herein may be used with a wide range of printed circuit board assemblies that contain card edge connectors, such as backplane assemblies and motherboard assemblies.

Other and different advantages are possible, in accordance with the many different possible implementations, as can be appreciated by one of ordinary skill in the art.

Figure 2:
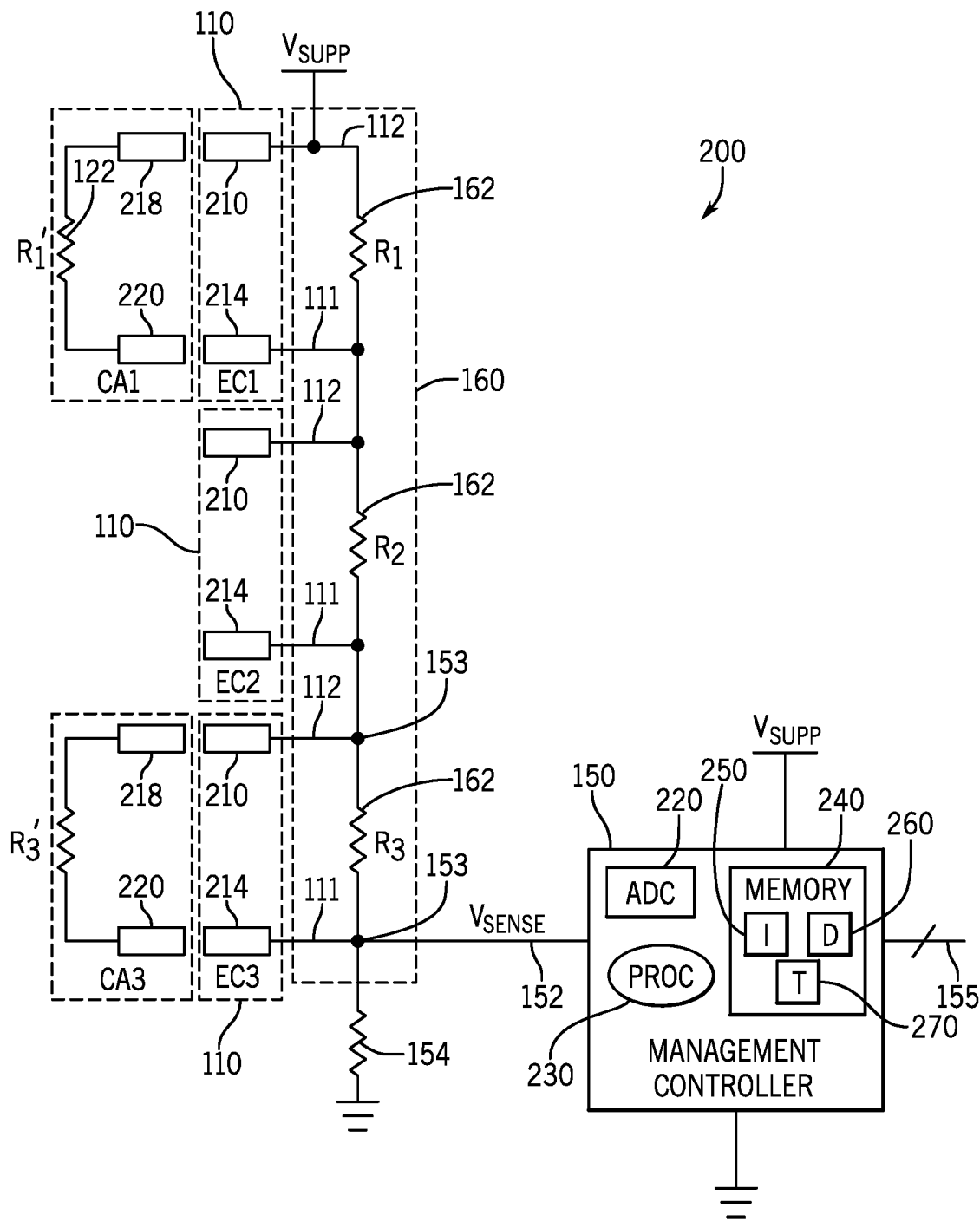
FIG. 2 is an electrical schematic diagram illustrating a circuit to detect a card edge connector configuration state according to example implementations.

FIG. 2 is an electrical schematic diagram 200 illustrating the electrical connections and the coupling of the resistors of the resistors 162 of the resistor network 162 the on-card resistors 122. As shown, for this example, the card edge connector EC1, among its various electrical contacts, has a corresponding pair of electrical contacts 210 and 214, which are coupled to the electrical traces 111 and 112. Moreover, when the circuit card assembly CA1 is installed in the card edge connector EC1 (as depicted for the example in FIGS. 1 and 2), the pair of electrical contacts 210 and 214 for the card edge connector EC1 couple to a corresponding pair 218 and 220 of electrical contacts of the circuit card assembly CA1, and the resistances R1' and R1 are coupled in parallel. n a similar manner, the R3' and R3 resistances are coupled in parallel for the card edge connector EC3.

As depicted in FIG. 2, the input 152 to the management controller 150 provides a voltage (called "$V_{SENSE}$" in FIG. 2). By reading the $V_{SENSE}$ voltage from the sense line 152, the management controller 150, in accordance with example implementations, may determine the specific card edge connector configuration state.

In accordance with example implementations, the management controller 150 may be a microcontroller that includes a processor 230 (a central processing unit (CPU) core, for example), a memory 240 and an analog-to-digital converter (ADC) 220. In general, the memory 240 is a non-transitory memory that may be formed from, as examples, semiconductor storage devices, phase change storage devices, magnetic storage devices, memristor-based devices, a combination of storage devices associated with multiple storage technologies, and so forth.

Regardless of its particular form, the memory 240 may store data representing a table 270, and the controller 250 may read data from the table 270 for purposes of correlating a particular $V_{SENSE}$ voltage to a specific card edge connector configuration state. In this manner, in accordance with example implementations, the $V_{SENSE}$ voltage may serve as an index to different card edge connector configuration states of the table 270

In addition to the table 270, the memory 240 may store other data 260 (data representing the measured $V_{SENSE}$ voltage, data representing the latest determined card edge connector configuration state, and so forth). The memory 240 may also store machine executable instructions 250 (or "software"), which may be executed by the processor 230 for purposes of performing various functions of the management controller 150 such as, for example, functions pertaining to reading the $V_{SENSE}$ voltage, using the read $V_{SENSE}$ voltage as an index to read data from the table 270 representing a card edge connector configuration state, communicating data with other devices or components of the computer system representing the card edge connector configuration state, and so forth.

As described herein, the processor 230 may, in accordance with example implementations, be a hardware that executes machine executable instructions. However, in accordance with further example implementations, the processor 230 may be a hardware circuit that performs management functions (including functions pertaining to determining the card edge connector configuration state, as described herein), in whole, or in part, without executing machine executable instructions. As examples, in accordance with these implementations, the processor 230 may be an application specific integrated circuit (ASIC) or a Field Programmable Gate Array (FPGA).

In accordance with example implementations, the management controller 150 may contain other components that are not specifically illustrated in FIG. 2. For example, the management controller 150 may contain a sample and hold circuit that samples and holds the $V_{SENSE}$ voltage 152, an analog voltage, so that the ADC 220 may convert the held analog voltage into a corresponding digital value. As another example, the management controller 150 may include a bus interface (an I²C bus interface, for example), which may communicate with other components of the computer system via a bus (i.e., part of communication lines 155, for example) for purposes of communicating the determined card edge connector configuration state to one or multiple other components of the computer system. Moreover, the management controller 150 may perform one or multiple other functions not related to detecting a card edge connector configuration state. Thus, many implementations are contemplated, which are within the scope of the appended claims.

FIG. 3 is a table 300 illustrating different potential card edge connector configuration states (in column 302 of the table 300) for the example case in which the card edge connector subassembly 100 includes three card edge connectors EC1, EC2 and EC3. For this specific example, it is assumed that there are three potential circuit card assemblies CA1, CA2 and CA3 that may be installed in the card edge connectors EC1, EC2 and EC3 in different orders. Moreover, for this example, it is assumed that the R1, R1', R2, R2', R3 and R3' resistances are 0.5 ohms, 2 ohms, 3 ohms, 4 ohms, 5 ohms and 6 ohms, respectively. Columns 304, 306 and 308 of table depict different individual states for the card edge connectors EC1, EC2 and EC3, respectively (i.e., each column depicts whether the associated card edge connector is empty or occupied, and if occupied, the particular circuit card assembly that is present in the connector).

As a more specific example, for row 320 of the table 300, circuit card assemblies CA1, CA2 and CA3 are inserted into card edge connectors EC1, EC2 and EC3, respectively, resulting in a card edge connector configuration state in which all circuit card assemblies CA1, CA2 and CA3 are present and inserted in a particular order, or order. For the state that is illustrated in row 320, column 310 of the table 300 depicts a corresponding pullup resistance of 4.84 ohms, and column 312 of the table 300 depicts a corresponding $V_{SENSE}$ voltage of 2.48 V.

As another example, row 322 of the table 300 depicts another state in which all three circuit card assemblies CA1, CA2 and CA3 are present and installed. However, for the state depicted in row 322, the circuit card assembly CA1 and CA2 are swapped, relative to the sequence in which the circuit card assemblies are installed in the state illustrated in row 320. In other words, for the state illustrated in row 322, the circuit card assemblies CA2, CA1 and CA3 are inserted into the card edge connectors EC1, EC2 and EC3, respectively. Therefore, for the state that is illustrated in row 322, the same group of circuit card assemblies are installed in the card edge EC1, EC2 and EC3 but in a different order than the state that is illustrated in row 320. This results in a different pullup resistance and a correspondingly different $V_{SENSE}$ voltage, as illustrated in columns 310 and 312 of table 300.

Row 324 of the table 300 illustrates another example card edge connector configuration state in which the card edge connectors EC1 and EC3 have corresponding circuit card assemblies CA3 and CA1 installed, and the middle card edge connector SC2 is empty. This state results in a different pullup resistance and $V_{SENSE}$ voltage, as illustrated in columns 310 and 312, respectively.

Figure 4:
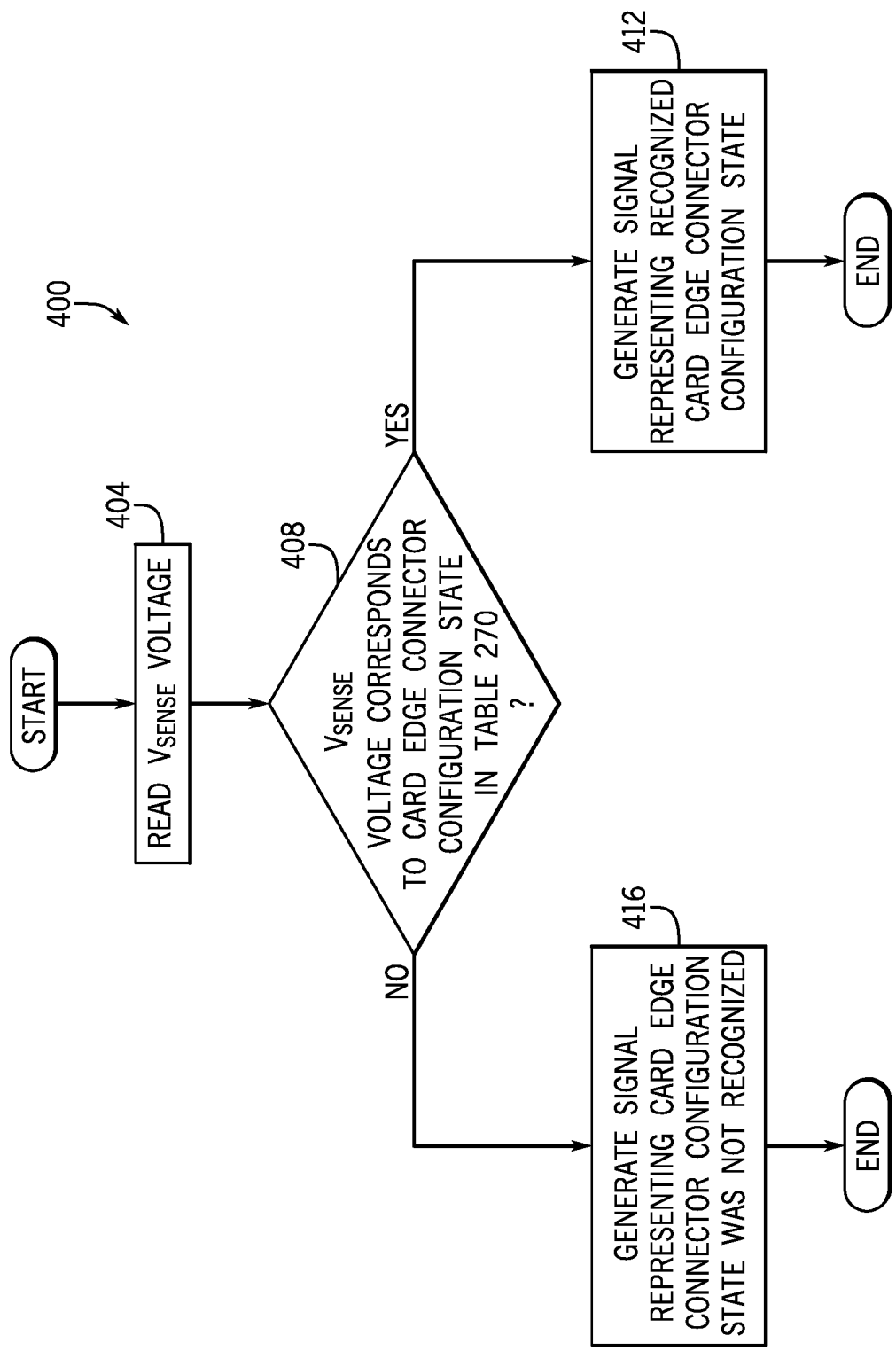
FIG. 4 is a flow diagram depicting a technique used by a management controller to detect a card edge connector configuration state according to an example implementation.
Figure 5:
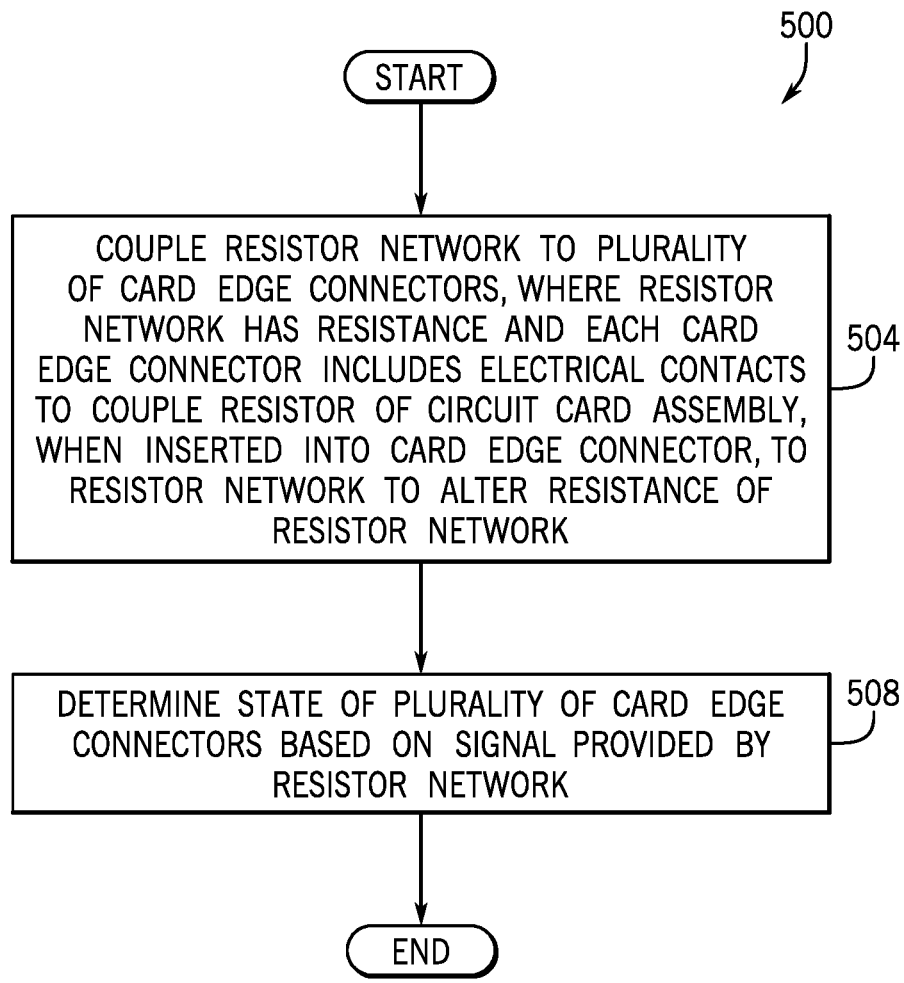
FIG. 5 is a flow diagram depicting a technique to determine a state of a plurality of card edge connectors according to an example implementation.

Referring to FIG. 4 in conjunction with FIG. 2, in accordance with example implementations, the management controller 150 may perform a technique 400 for purposes of detecting the card edge connector configuration state. Pursuant to the technique 400, the management controller 150 may read (block 404) the $V_{SENSE}$ voltage. For example, in accordance with some implementations, the processor 230 may execute one or multiple machine executable instructions that cause the management controller 150 to use the ADC 220 to convert the $V_{SENSE}$ voltage into a digital value and further cause the processor 230 to read this digital value.

Next, pursuant to decision block 408, the management controller 150 may determine whether the read $V_{SENSE}$ voltage corresponds to a card edge connector configuration state in the table 270. In this manner, in accordance with example implementations, the processor 230 may execute one or multiple instructions that cause the processor 230 to use the $V_{SENSE}$ voltage as an index for the table 270 for purposes of looking up a particular card edge connector configuration state in the table 270, which matches the index.

In accordance with example implementations, the $V_{SENSE}$-based index may not match any of the card edge connector configurations that are stored in the table 270, as, for example, an unidentified circuit card assembly may be inserted into a card edge connector, circuit card assemblies may be inserted into an unauthorized or unrecognized sequence in the card edge connectors, and so forth. When this occurs, the management controller 150 may generate a signal, pursuant to block 416, which represents that the card edge connector configuration state was not recognized. For example, the signal may be data stored in a memory of the computer system, a message communicated over a management bus, and so forth. However, of the slot configuration of the card edge connector configuration state is recognized, then, pursuant to block 412, the management controller 150 may generate a signal representing a recognized card edge connector configuration state (i.e., generate a bus message, store data in a memory, and so forth).

Thus, in accordance with example implementations, a technique 500 includes coupling (block 504) a resistor network to a plurality of card edge connectors. The resistor network has a resistance, and each card edge connector includes electrical contacts to couple a resistor of a circuit card assembly, when inserted into the card edge connector, to the resistor network to alter the resistance of the resistor network. The technique 500 includes determining (block 508) a state of the plurality of card edge connectors based on a signal that is provided by the resistor network.

Figure 6:
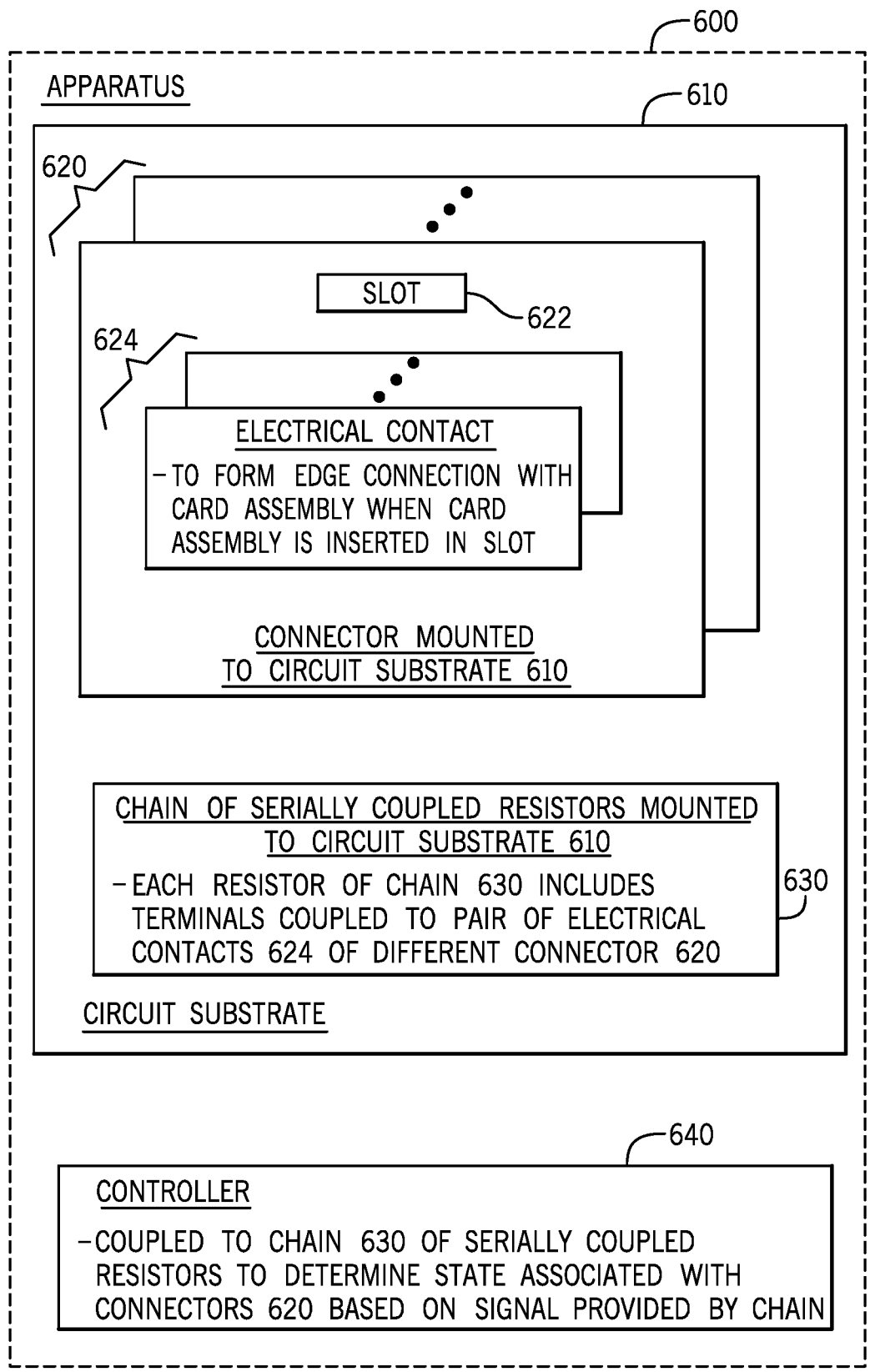
FIG. 6 is a schematic diagram of an apparatus to determine a state associated with a plurality of connectors according to an example implementation.

Referring to FIG. 6, in accordance with example implementations, an apparatus 600 includes a circuit substrate 610, a plurality of connectors 620 that are mounted to the circuit substrate 610; a chain 630 of serially coupled resistors that are mounted to the circuit substrate 610; and a controller 640. Each connector 620 includes a slot 622 and electrical contacts 624 to form an edge connection with a card assembly when the card assembly is inserted into the slot 622. Each resistor of the chain 630 includes terminals coupled to a pair of the electrical contacts 624 of a different connector 620; and the controller 640 is coupled to the chain 630 to determine a state that is associated with the connectors 620 based on a signal that is provided by the chain 630.

Figure 7:
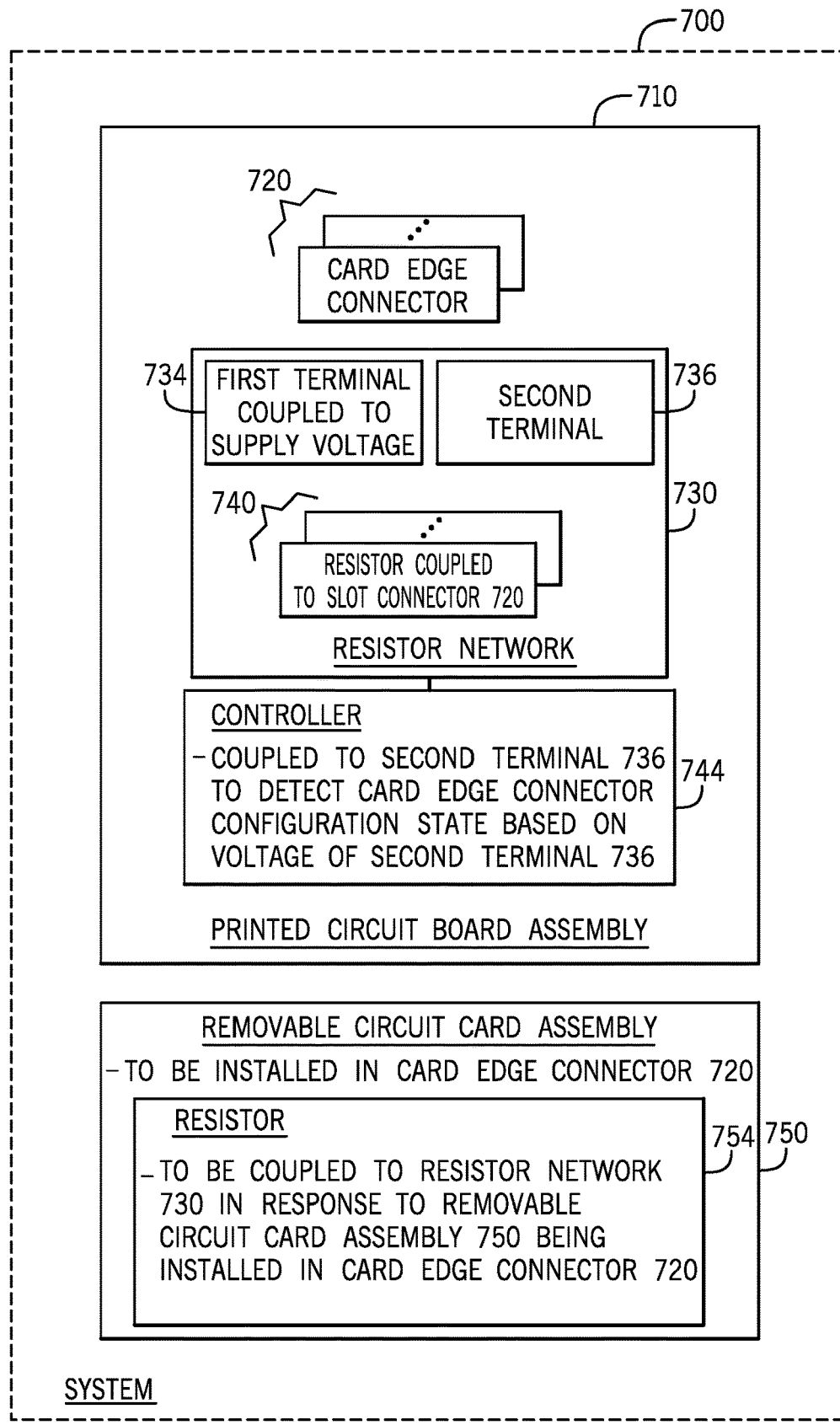
FIG. 7 is a schematic diagram of a system to detect a card edge connector configuration state according to an example implementation.

Referring to FIG. 7, a system 700, in accordance with example implementations, includes a printed circuit board assembly 710 and a removable circuit card assembly 750. The printed circuit board assembly 710 includes a plurality of card edge connectors 720; a resistor network 730; and a controller 744. The resistor network 730 includes a first terminal 734, a second terminal 736 and a plurality of resistors 740 that are coupled to the plurality of card edge connectors 720. The first terminal 734 is coupled to a supply voltage. The controller 744 is coupled to the second terminal 730 to detect a card edge connector configuration state associated with the card edge connector 720 based on a voltage of the second terminal 736. The removable circuit card assembly 750 is to be installed in a card edge connector 720 and includes a resistor 754 to be coupled to the resistor network 730 in response to the removable circuit card assembly 750 being installed in the card edge connector 720.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a circuit substrate;
   a plurality of connectors mounted to the circuit substrate, wherein each connector of the plurality of connectors comprises a slot and electrical contacts form an edge connection with a card assembly when the card assembly is inserted into the slot;
   a chain of serially coupled resistors mounted to the circuit substrate, wherein each resistor comprises terminals coupled to a pair of the electrical contacts of a different connector of the plurality of connectors; and
   a controller coupled to the chain of serially coupled resistors to determine a state associated with the plurality of connectors based on a signal provided by the chain.

2. The apparatus of claim 1, wherein the controller comprises an input terminal to receive the signal, and the chain of serially coupled resistors is coupled between a power supply voltage and the input terminal.

3. The apparatus of claim 1, wherein each resistor of the chain of serially coupled resistors has a different resistance.

4. The apparatus of claim 1, wherein the circuit substrate comprises a motherboard or a backplane substrate.

5. The apparatus of claim 1, wherein the state identifies at least one of a category associated with a card assembly inserted into a given connector of the plurality of connectors, or the presence of the card assembly inserted into the given connector.

6. The apparatus of claim 1, wherein the state identifies at categories associated with card assemblies inserted into multiple connectors of the plurality of connectors.

7. The apparatus of claim 1, wherein a resistance of the chain is a function of the resistances of the resistors of the chain and resistances of resistors of circuit card assemblies inserted into the connectors.

8. A system comprising:
   a printed circuit board assembly comprising:
      a plurality of card edge connectors;
      a resistor network comprising a first terminal, a second terminal, and a plurality of resistors coupled to the plurality of card edge connectors, wherein the first terminal is coupled to a supply voltage; and
      a controller coupled to the second terminal of the resistor network to detect a card edge connector configuration state associated with the plurality of card edge connectors based on a voltage of the second terminal; and
   a removable circuit card assembly to be installed in a card edge connector of the plurality of card edge connectors, wherein the removable circuit card assembly comprises a resistor to be coupled to the resistor network in response to the removable circuit card assembly being installed in the card edge connector.

9. The system of claim 8, wherein the resistor network comprises a chain of serially coupled resistors between the first and second terminals.

10. The system of claim 8, wherein the removable circuit card assembly comprises at least one of a server card, a storage card, or an expansion card.

11. The system of claim 8, wherein the printed circuit board assembly comprises a backplane assembly or a motherboard assembly.

12. The system of claim 8, wherein each resistor of the plurality of resistors has a different resistance.

* * * * *